(12) United States Patent
Liang et al.

(10) Patent No.: US 10,394,191 B1
(45) Date of Patent: Aug. 27, 2019

(54) TIME-TO-DIGITAL CONVERTER

(71) Applicants: Delta Electronics Int'l (Singapore) Pte Ltd, Singapore (SG); Nanyang Technological University, Singapore (SG)

(72) Inventors: Zhipeng Liang, Singapore (SG); Chirn Chye Boon, Singapore (SG); Xiang Yi, Singapore (SG); Jack Sheng Kee, Singapore (SG)

(73) Assignees: DELTA ELECTRONICS INT'L (SINGAPORE) PTE LTD, Singapore (SG); NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 15/989,347

(22) Filed: May 25, 2018

(30) Foreign Application Priority Data

Mar. 27, 2018 (SG) .......................... 10201802514R (51) Int. Cl.
*G04F 10/00* (2006.01)
*H03M 1/08* (2006.01)

(52) U.S. Cl.
CPC ........ *G04F 10/005* (2013.01); *H03M 1/0836* (2013.01); *H03M 1/0854* (2013.01)

(58) Field of Classification Search
CPC .. G04F 10/005; H03M 1/0836; H03M 1/0854
USPC ........................................................ 341/155
See application file for complete search history.

(56) References Cited

U.S. PATENT DOCUMENTS

| | | | | |
|---|---|---|---|---|
| 5,576,664 A | * | 11/1996 | Herold | .................... H03L 7/091 331/1 A |
| 8,090,068 B2 | * | 1/2012 | Sun | ......................... H03L 7/085 375/376 |
| 8,531,322 B2 | | 9/2013 | Cao | |
| 8,593,189 B1 | * | 11/2013 | Yen | ........................ H03L 7/085 327/147 |
| 8,860,512 B2 | * | 10/2014 | Schimper | ............. H03K 3/0315 327/158 |
| 9,270,288 B2 | | 2/2016 | Perrott | |

* cited by examiner

*Primary Examiner* — Brian K Young
(74) *Attorney, Agent, or Firm* — Kirton McConkie; Evan R. Witt (57) ABSTRACT

A time-to-digital converter is provided. The time-to-digital converter comprises an oscillator controller, an invertible oscillator and a measurement circuit. The oscillator controller receives a start signal and a stop signal and outputs a mode signal. The invertible oscillator is electrically connected with the oscillator controller for receiving the mode signal. The oscillation direction of the invertible oscillator is inverted according to the mode signal, and the invertible oscillator outputs plural delay signals. The measurement circuit is electrically connected with the invertible oscillator for receiving the plural delay signals. The measurement circuit receives a sampling signal, samples the plural delay signals in accordance with the sampling signal, and outputs an output signal.

15 Claims, 7 Drawing Sheets

|   | 0 | 1 | 2 | 3 | 4 | 5 | 6 | 7 | 8 | 9 |
|---|---|---|---|---|---|---|---|---|---|---|
| $O_1$ | 0 | 1 | 1 | 1 | 1 | 1 | 0 | 0 | 0 | 0 |
| $O_2$ | 1 | 1 | 1 | 0 | 0 | 0 | 0 | 1 | 1 | 1 |
| $O_3$ | 0 | 0 | 0 | 1 | 1 | 0 | 0 | 1 | 1 | 1 |
| $O_4$ | 1 | 1 | 0 | 0 | 1 | 1 | 0 | 0 | 1 | 0 |
| $O_5$ | 0 | 0 | 0 | 0 | 1 | 1 | 1 | 1 | 1 | 1 |
| Sphase | 0 | 1 | 2 | 3 | 4 | 5 | 6 | 7 | 8 | 9 |

TIME-TO-DIGITAL CONVERTER

CROSS-REFERENCE TO RELATED APPLICATION

This application claims priority to Singapore Patent Application No. 10201802514R, filed on Mar. 27, 2018. The entire content of the above-mentioned patent application is incorporated herein by reference for all purposes.

FIELD OF THE DISCLOSURE

The present disclosure relates to a time-to-digital converter, and more particularly to a time-to-digital converter having an oscillator with invertible oscillation direction.

BACKGROUND OF THE DISCLOSURE

Time domain and digital domain have been regarded as the reliable representations for analog information processing in finer scale geometries. A time-to-digital converter is commonly used in a processing system circuit to convert the time information into the digital representation. The time-to-digital converter is widely applied in thriving areas including digital phase-locked loops (DPLL) for radio frequency (RF) wireless communication systems, the time-based analog-to-digital converter and the time-of-flight (ToF) ultrasonic sensing. Meanwhile, different modules within such a system usually share the power supply, which leads to the consideration of the noise coupling among these modules through the power supply.

Normally, noise shaping time-to-digital converters achieve the noise reduction within the output signal bandwidth by shaping the quantization error through utilizing a controlled oscillator, such as a gated ring oscillator or a switched ring oscillator. However, the in-band output noise is dominated by the phase noise of the oscillator, and previously there is no technique to reduce the impact from such phase noise. Moreover, the oscillator is sensitive to the power noise, and the oscillator introduces their operation noise to the power supply at the same time. Thus, for protecting other modules from disturbance, an extra power supply separated from other modules is needed for the time-to-digital converter based on the oscillator in a higher-level system, which is disadvantageous in terms of the overall system design.

Therefore, there is a need of providing a time-to-digital converter to obviate the drawbacks encountered from the prior arts.

SUMMARY OF THE DISCLOSURE

It is an object of the present disclosure to provide a time-to-digital converter with an invertible oscillator. By utilizing two opposite oscillation directions of the same invertible oscillator, the impact of the oscillator phase noise to the output of the time-to-digital converter is reduced. In addition, the output of the time-to-digital converter is insensitive to the interference from the power supply since the impact of the power noise is partly cancelled out. Besides, the time-to-digital converter introduces only weak switching noise to the power supply because it only changes its oscillation direction and draws same amount of supply current during its operation. Therefore, the time-to-digital converter can share the same power supply with other modules in a higher-level time-to-digital converter application system without disturbing their operation. Due to its noise immunity and low disturbance to power supply, the time-to-digital converter can greatly reduce the design complexity of power supply in the application system.

In accordance with an aspect of the present disclosure, there is provided a time-to-digital converter. The time-to-digital converter comprises an oscillator controller, an invertible oscillator and a measurement circuit. The oscillator controller receives a start signal and a stop signal and outputs a mode signal. The invertible oscillator is electrically connected with the oscillator controller for receiving the mode signal. The oscillation direction of the invertible oscillator is inverted according to the mode signal, and the invertible oscillator outputs plural delay signals. The measurement circuit is electrically connected with the invertible oscillator for receiving the plural delay signals. The measurement circuit receives a sampling signal, samples the plural delay signals in accordance with the sampling signal, and outputs an output signal.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
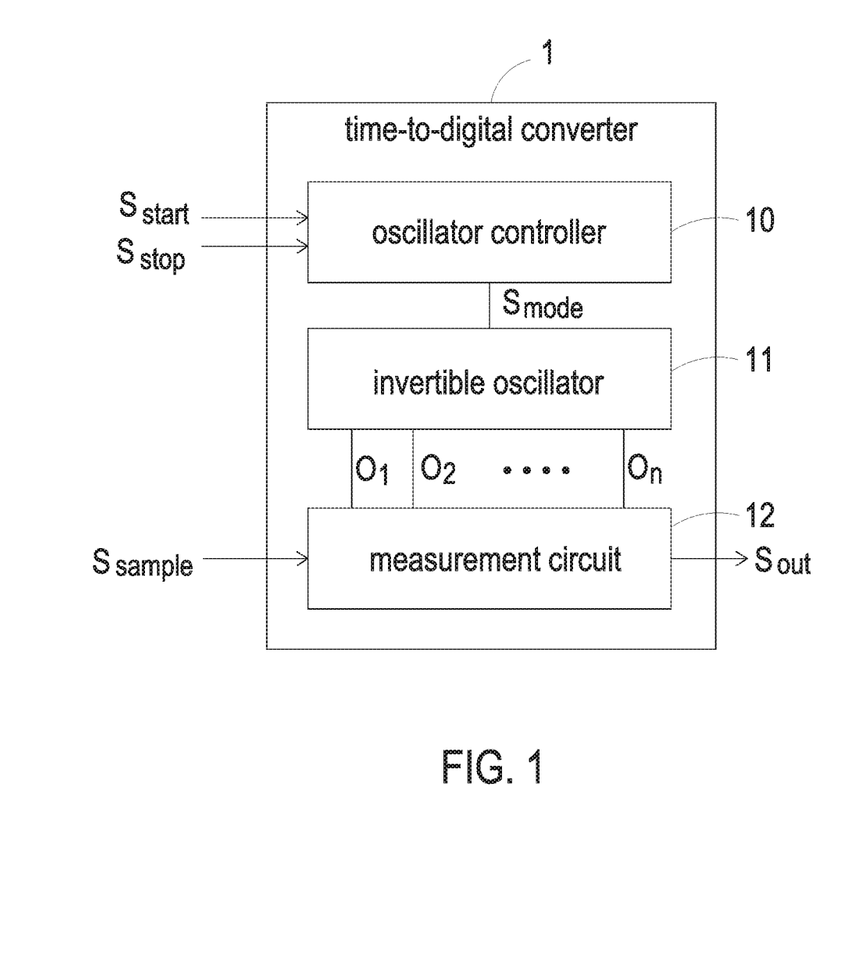
FIG. 1 is a block diagram illustrating a time-to-digital converter according to an embodiment of the present disclosure.

FIG. 1 is a block diagram illustrating a time-to-digital converter according to an embodiment of the present disclosure. As shown in FIG. 1, the time-to-digital converter 1 includes an oscillator controller 10, an invertible oscillator 11 and a measurement circuit 12.

The oscillator controller 10 receives a start signal $S_{start}$ and a stop signal $S_{stop}$, and outputs a mode signal $S_{mode}$ according to the start signal $S_{start}$ and the stop signal $S_{stop}$. In an embodiment, preferably but not exclusively, the level of the mode signal $S_{mode}$ is changed while the start signal $S_{start}$ or the stop signal $S_{stop}$ is at the rising edge.

The invertible oscillator 11 is electrically connected with the oscillator controller 10 for receiving the mode signal $S_{mode}$, and the invertible oscillator 11 outputs plural delay signals. In this embodiment, the oscillation direction of the invertible oscillator 11 is inverted in accordance with the mode signal $S_{mode}$. When the oscillation direction of the invertible oscillator 11 is inverted, the transmitting sequence of the plural delay signals is reversed accordingly.

The measurement circuit 12 receives a sampling signal $S_{sample}$ and is electrically connected with the invertible oscillator 11 for receiving the plural delay signals. The measurement circuit 12 samples the plural delay signals according to the sampling signal $S_{sample}$ and outputs a digital output signal $S_{out}$. The output signal $S_{out}$ represents a time difference between the time durations of two opposite oscillation directions.

In an embodiment, the invertible oscillator 11 includes n delay stages and outputs n delay signals $O_1$ to $O_n$, where n is a positive integer larger than 2. When the start signal $S_{start}$ arrives, the level of the mode signal $S_{mode}$ for controlling the invertible oscillator 11 is changed, and the invertible oscillator 11 oscillates in a direction that the delay signals $O_1$ to $O_n$ transmits following a first sequence of, for example, the first delay signal $O_1$, the second delay signal $O_2$, the third delay signal $O_3$ through the nth delay signal $O_n$. When the stop signal $S_{stop}$ occurs, the mode signal $S_{mode}$ is changed and controls the invertible oscillator 11 to oscillate in the other oscillation direction that the delay signals $O_1$ to $O_n$ transmits following a second sequence of, for example, the nth delay signal $O_n$, the (n−1)th delay signal $O_{n-1}$, the (n−2)th delay signal $O_{n-2}$ through the first delay signal $O_1$. The second sequence is opposite to the first sequence. Moreover, the delay signals $O_1$ to $O_n$ are mapped to a digital representation of the oscillator phase. Therefore, the measurement circuit 12 obtains the output signal $S_{out}$ by subtraction between the digital representations of the oscillator phase at different sampling time.

Figure 2:
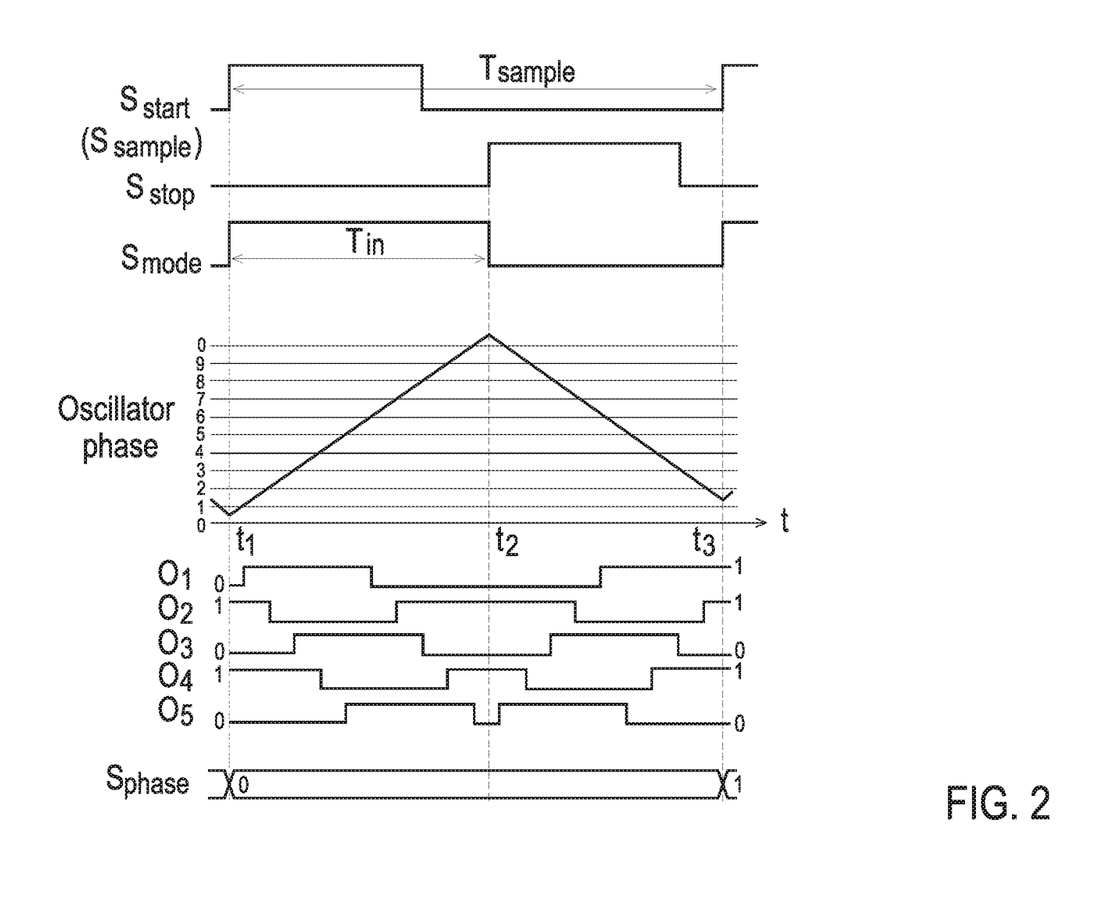
FIG. 2 is a timing diagram illustrating an exemplary operation of the time-to-digital converter of FIG. 1.
Figure 3:
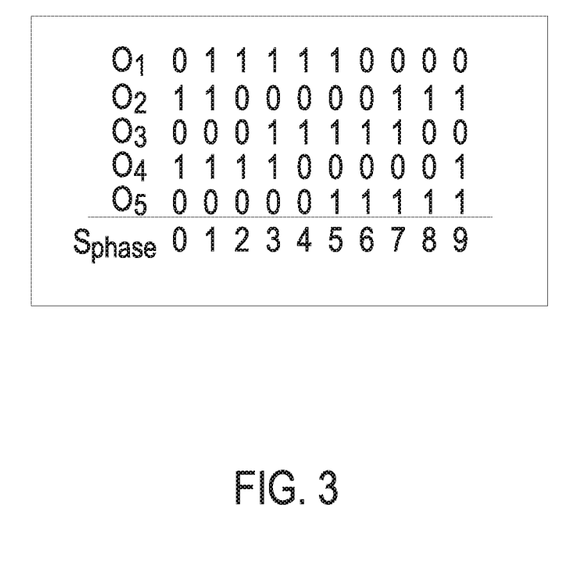
FIG. 3 is a table showing the relations between the digital code composed of the delay signals and the digital representation of the oscillator phase.

FIG. 2 is a timing diagram illustrating an exemplary operation of the time-to-digital converter of FIG. 1. In an embodiment, as shown in FIG. 2, the n is for example but not limited to be 5, and the start signal $S_{start}$ is also used as the sampling signal $S_{sample}$. Upon the rising edge of the start signal $S_{start}$ at time $t_1$, the oscillator controller 10 generates a mode signal $S_{mode}$ at high level, and the delay signals $O_1$ to $O_5$ transmit following $O_1$, $O_2$ through $O_5$. In response to the rising edge of the stop signal $S_{stop}$ at time $t_2$, the oscillator controller 10 outputs the mode signal $S_{mode}$ at low level. Thus, the oscillation direction of the invertible oscillator 11 is reversed, and the delay signals $O_1$ to $O_5$ transmit following $O_5$, $O_4$ through $O_1$. Similarly, the mode signal $S_{mode}$ and the oscillation direction of the invertible oscillator 11 are changed when the next rising edge of the start signal $S_{start}$ arrives at time $t_3$. According to the rising edge of the sampling signal $S_{sample}$, the measurement circuit 12 samples the delay signals $O_1$ to $O_5$ at time $t_1$ and $t_3$. The delay signals $O_1$ to $O_5$ compose a digital code "01010" at time $t_1$ and a digital code "11010" at time $t_3$. In accordance with the table showing the relations between the digital code composed of the delay signals $O_1$ to $O_5$ and the digital representation of the sampled oscillator phase $S_{phase}$ in FIG. 3, the digital code "01010" at time $t_1$ is mapped to the digitized oscillator phase $S_{phase}$ equal to 0, and the digital code "11010" at time $t_3$ is mapped to the digitized oscillator phase $S_{phase}$ equal to 1. Consequently, the measurement circuit 12 obtains the output signal $S_{out}$ by subtracting the digitized oscillator phase $S_{phase}$ equal to 0 from the digitized oscillator phase $S_{phase}$ equal to 1. The output signal $S_{out}$ represents the increment of the transition position during a time-to-digital conversion cycle.

In addition, the time difference $T_{diff}$ between the time duration of the mode signal $S_{mode}$ at high level and the time duration of the mode signal $S_{mode}$ at low level is achieved by the equation (1):

$$T_{diff} = S_{out} \times t_{stage} \tag{1}$$

where $t_{stage}$ is the average internal stage delay. With a known sampling clock period $T_{sample}$, the input time $T_{in}$ equal to the time duration of the mode signal $S_{mode}$ at high level is calculated by the equations (2) and (3):

$$T_{in} = (T_{sample} + T_{diff})/2 \tag{2}$$

$$T_{in} = (T_{sample} + S_{out} \times t_{stage})/2 \tag{3}$$

Due to the dividing by 2 in the input time $T_{in}$ calculation, the resolution of the time-to-digital converter 1 is defined by $t_{stage}/2$, which is half of the internal stage delay.

It is noted that the time-to-digital converter 1 of the present disclosure achieves a raw resolution as small as half of the internal stage delay $t_{stage}$. Compared with the prior time-to-digital converters with raw resolution equal to or larger than the internal stage delay, the time-to-digital converter 1 of the present disclosure has a higher gain, and thus the impact of the quantization error and the impact of the oscillator phase noise to the output noise of the time-to-digital converter 1 are reduced. Moreover, since the power noise from the power supply affects both oscillation directions of the invertible oscillator 11, the impact of the power noise to the output of the time-to-digital converter 1 can be partly cancelled when the measurement circuit 12 subtracts the negative phase increment from the positive phase increment for achieving the output signal $S_{out}$. Therefore, since the time-to-digital converter 1 can reject the influence from the power noise, the time-to-digital converter 1 can use a power supply with some amount of noise without degrading much its own noise performance. Furthermore, during the time-to-digital conversion, the invertible oscillator 11 changes only its oscillation direction and remains the same oscillation frequency. Thus, the time-to-digital converter 1 draws constant supply current and introduces only weak switching noise to the power supply. Consequently, the time-to-digital converter 1 can share the same power supply with other modules in a higher-level TDC application system without disturbing their operation.

Figure 4:
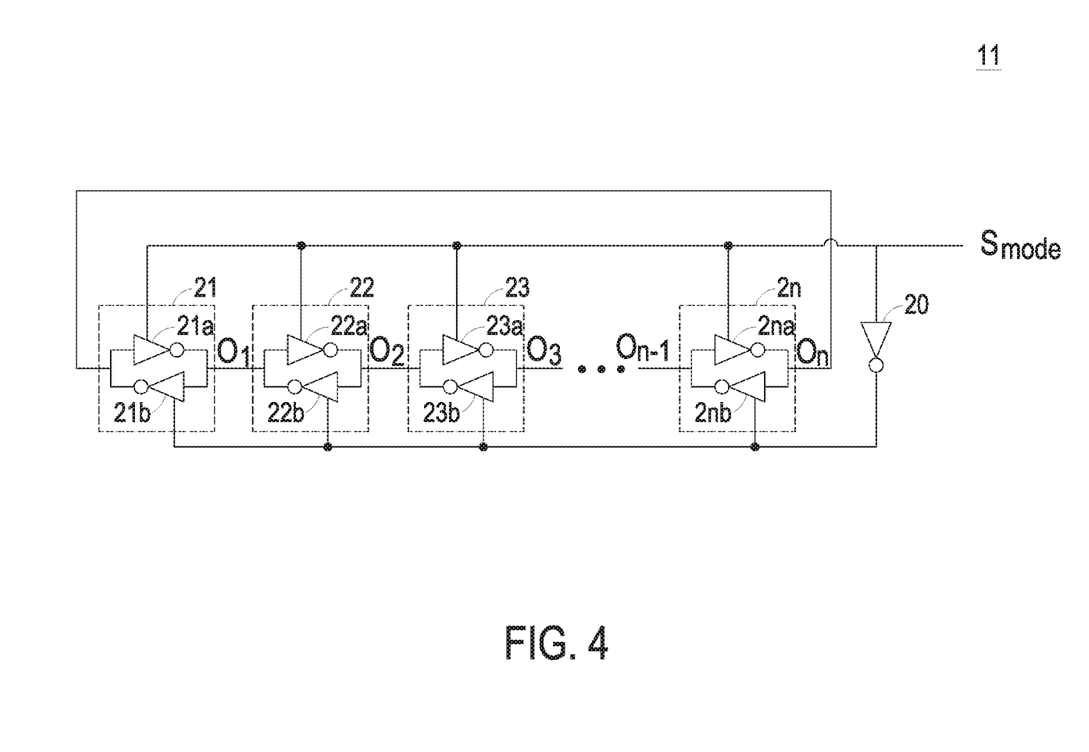
FIG. 4 is a schematic diagram illustrating an example of the invertible oscillator of the time-to-digital converter of FIG. 1.

FIG. 4 is a schematic diagram illustrating an example of the invertible oscillator of the time-to-digital converter of FIG. 1. In this embodiment, as shown in FIG. 4, the invertible oscillator 11 includes a mode inverter 20 and plural invertible delay units 21 to 2n as delay stages. The number of the delay units 21 to 2n is equal to the number of the delay signals $O_1$ to $O_n$. The mode inverter 20 is electrically connected with each of the delay units 21 to 2n, each of the delay units 21 to 2n includes two input-output ports, and the plural input-output ports of the delay units 21 to 2n are connected in a ring. Each of the delay units 21 to 2n has a first internal inverter (21a to 2na) and a second internal inverter (21b to 2nb), one input-output port is electrically connected with an input terminal of the first internal inverter (21a to 2na) and an output terminal of the second internal inverter (21b to 2nb), and the other input-output port is electrically connected with an output terminal of the first internal inverter (21a to 2na) and an input terminal of the second internal inverter (21b to 2nb). Taking the delay unit 22 for example, the delay unit 22 connects to delay signals $O_1$ and $O_2$. When the mode signal $S_{mode}$ is at high level, the first internal inverter 22a is enabled, and the second internal inverter 22b is disabled. Therefore, the first delay signal $O_1$ drives the second delay signal $O_2$ through the delay unit 22. Since all the delay units 21 to 2n share the same mode signal $S_{mode}$, the oscillation follows the sequence of the delay signals $O_1$, $O_2$, $O_3$ through $O_n$. Alternatively, when the mode signal $S_{mode}$ is at low level, the first internal inverter 22a is disabled, and the second internal inverter 22b is enabled. Therefore, the second delay signal $O_2$ drives the first delay signal $O_1$ through the delay unit 22. Since all the delay units 21 to 2n share the same mode signal $S_{mode}$, the oscillation follows the sequence of the delay signals $O_n$, $O_{n-1}$, $O_{n-2}$ through $O_1$.

Figure 5:
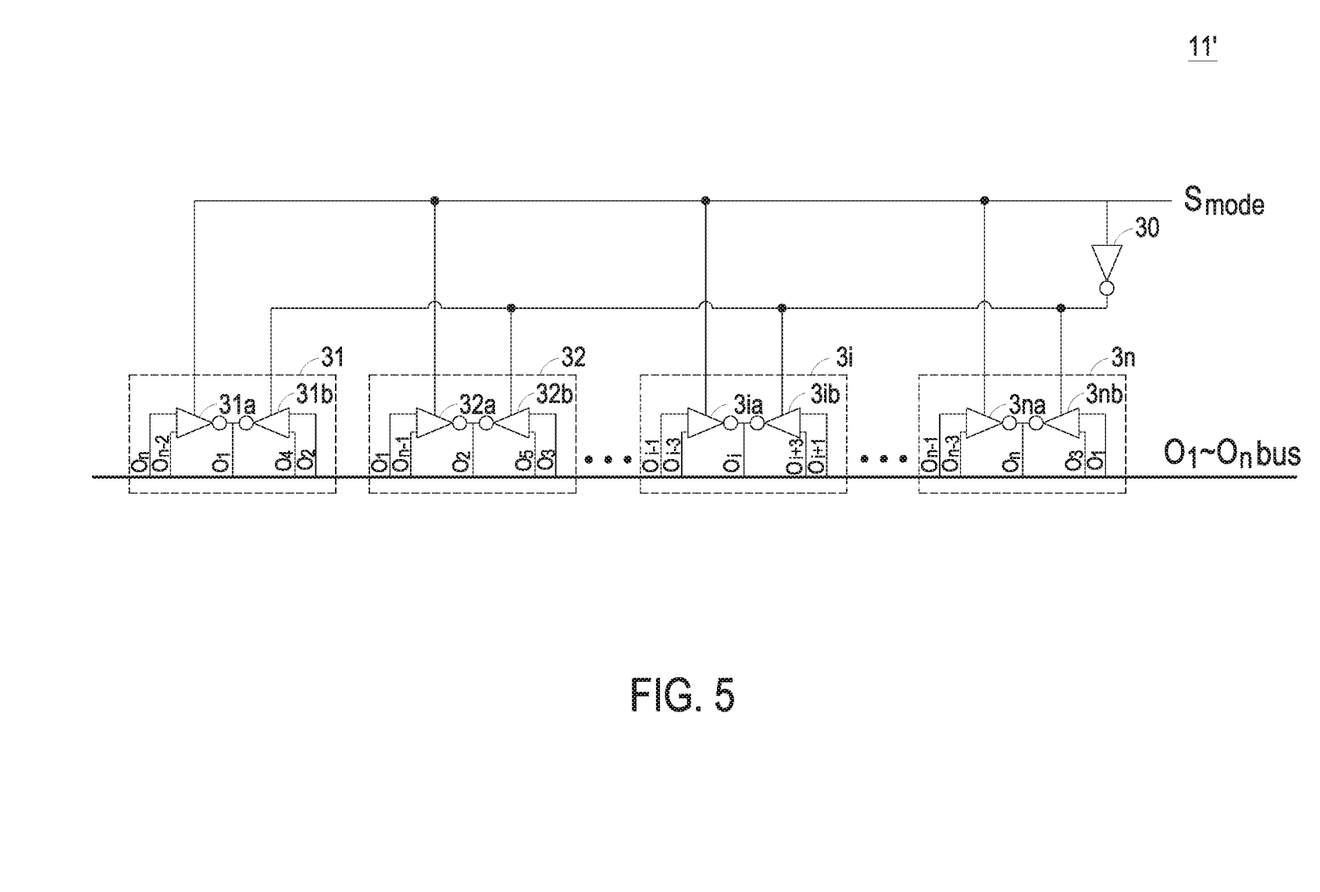
FIG. 5 is a schematic diagram illustrating another example of the invertible oscillator of the time-to-digital converter of FIG. 1.

FIG. 5 is a schematic diagram illustrating another example of the invertible oscillator of the time-to-digital converter of FIG. 1. In this embodiment, as shown in FIG. 5, the invertible oscillator 11' includes a mode inverter 30 and plural invertible delay units 31 to 3n as delay stages. The number of the delay units 31 to 3n is equal to the number of the delay signals $O_1$ to $O_n$. The mode inverter 30 is electrically connected with each of the delay units 31 to 3n, and each of the delay units 31 to 3n is electrically connected with a bus transmitting the delay signals $O_1$ to $O_n$. Each of the delay units 31 to 3n includes plural input ports and one output port connected to several stages in the ring. As shown in FIG. 5, for example but not exclusively, each of the delay units 31 to 3n includes four input ports. Each of the delay units 31 to 3n has a first internal inverter (31a to 3na) and a second internal inverter (31b to 3nb), and an output terminal of the first internal inverter (31a to 3na) is electrically connected with an output terminal of the second internal inverter (31b to 3nb). Taking the delay unit 3i for example, where i is a positive integer larger than 2 and smaller than n. The delay unit 3i outputs the delay signal $O_i$, takes the delay signals $O_{i-1}$ and $O_{i-3}$ from the preceding stages as one set of its inputs, and symmetrically takes the delay signals $O_{i+1}$ and $O_{i+3}$ from the succeeding stages as the other set of its inputs. When the mode signal $S_{mode}$ is at high level, the first internal inverter 3ia is enabled, and the second internal inverter 3ib is disabled. Therefore, the delay signal $O_i$ is driven by the delay signal $O_{i-1}$ and $O_{i-3}$ through the delay unit 3i. Since all the delay units 31 to 3n share the same mode signal $S_{mode}$, the oscillation follows the sequence of the delay signals $O_1$, $O_2$, $O_3$ through $O_n$. Alternatively, when the mode signal $S_{mode}$ is at low level, the first internal inverter 3ia is disabled, and the second internal inverter 3ib is enabled. Therefore, the delay signal $O_i$ is driven by the delay signals $O_{i+1}$ and $O_{i+3}$ through the delay unit 3i. Since all the delay units 31 to 3n share the same mode signal $S_{mode}$, the oscillation follows the sequence of the delay signals $O_n$, $O_{n-1}$, $O_{n-2}$ through $O_1$.

Figure 6:
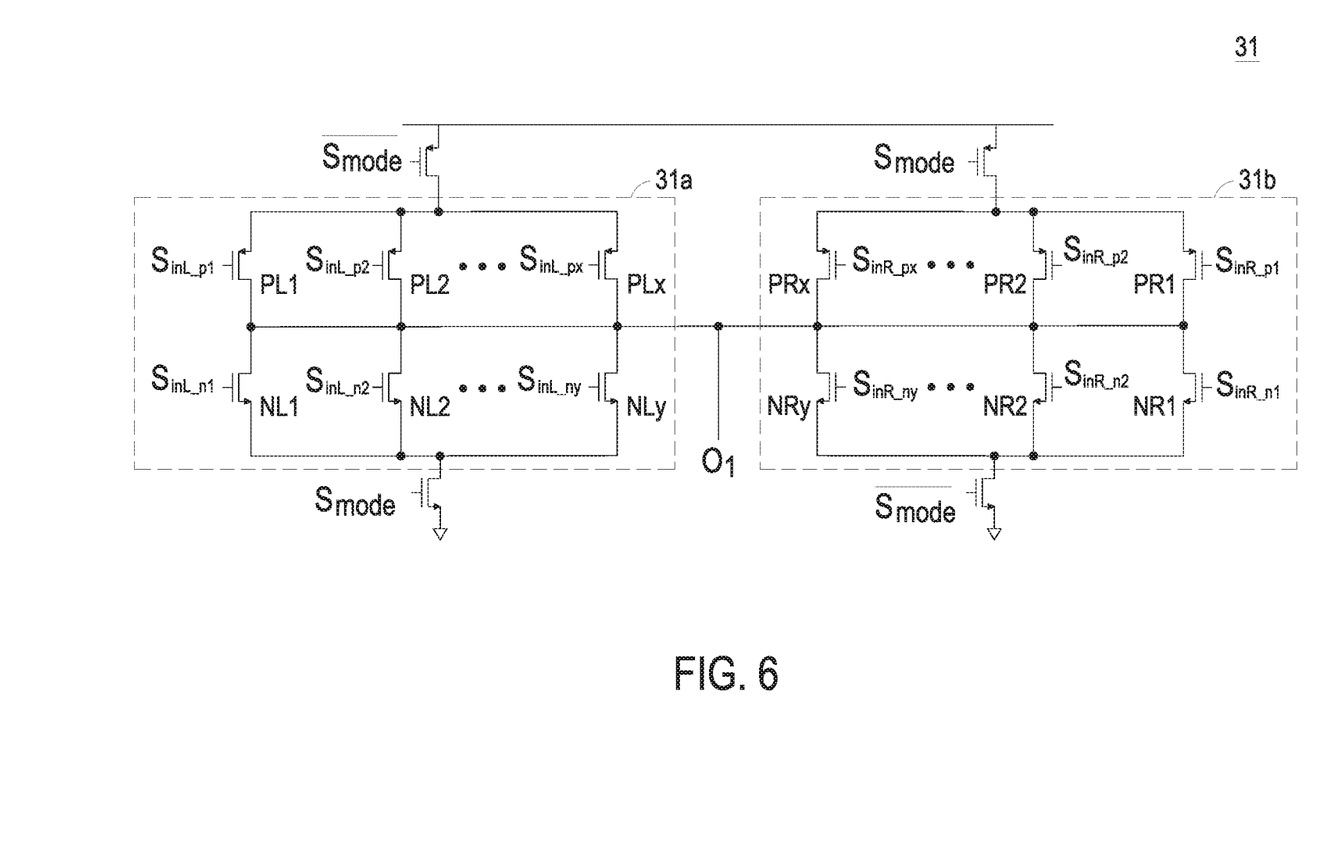
FIG. 6 is a schematic diagram illustrating the delay unit of the invertible oscillator of FIG. 5.

FIG. 6 is a schematic diagram illustrating the delay unit of the invertible oscillator of FIG. 5. As shown in FIG. 6, taking the delay unit 31 for example, the first internal inverter 31a includes plural transistors PL1, PL2 to PLx and NL1, NL2 to NLy, and the second internal inverter 31b includes plural transistors PR1, PR2 to PRx and NR1, NR2 to NRy, where x and y are the positive integers. The transistors PL1 to PLx are symmetrical to the transistors PR1 to PRx respectively, and the transistors NL1 to NLy are symmetrical to the transistors NR1 to NRy respectively. The two internal inverters 31a and 31b takes their inputs from other delay stages in the ring with symmetrical allocations. The input signals $S_{inL\_p1}$, $S_{inL\_p2}$ through $S_{inL\_px}$ and $S_{inL\_n1}$, $S_{inL\_n2}$ through $S_{inL\_ny}$ and the input signals $S_{inR\_p1}$, $S_{inR\_p2}$ through $S_{inR\_px}$ and $S_{inR\_n1}$, $S_{inR\_n2}$ through $S_{inR\_ny}$ are taken from other delay signals $O_2$ to $O_n$ of the invertible oscillator 11', and may be from different delay signals. Using the delay unit (31 to 3n) with multiple-input structure, the phase error injected by the switching can be averaged by more transition stages, and lower phase distortion can be achieved when the invertible oscillator 11' changes its oscillation direction.

Figure 7:
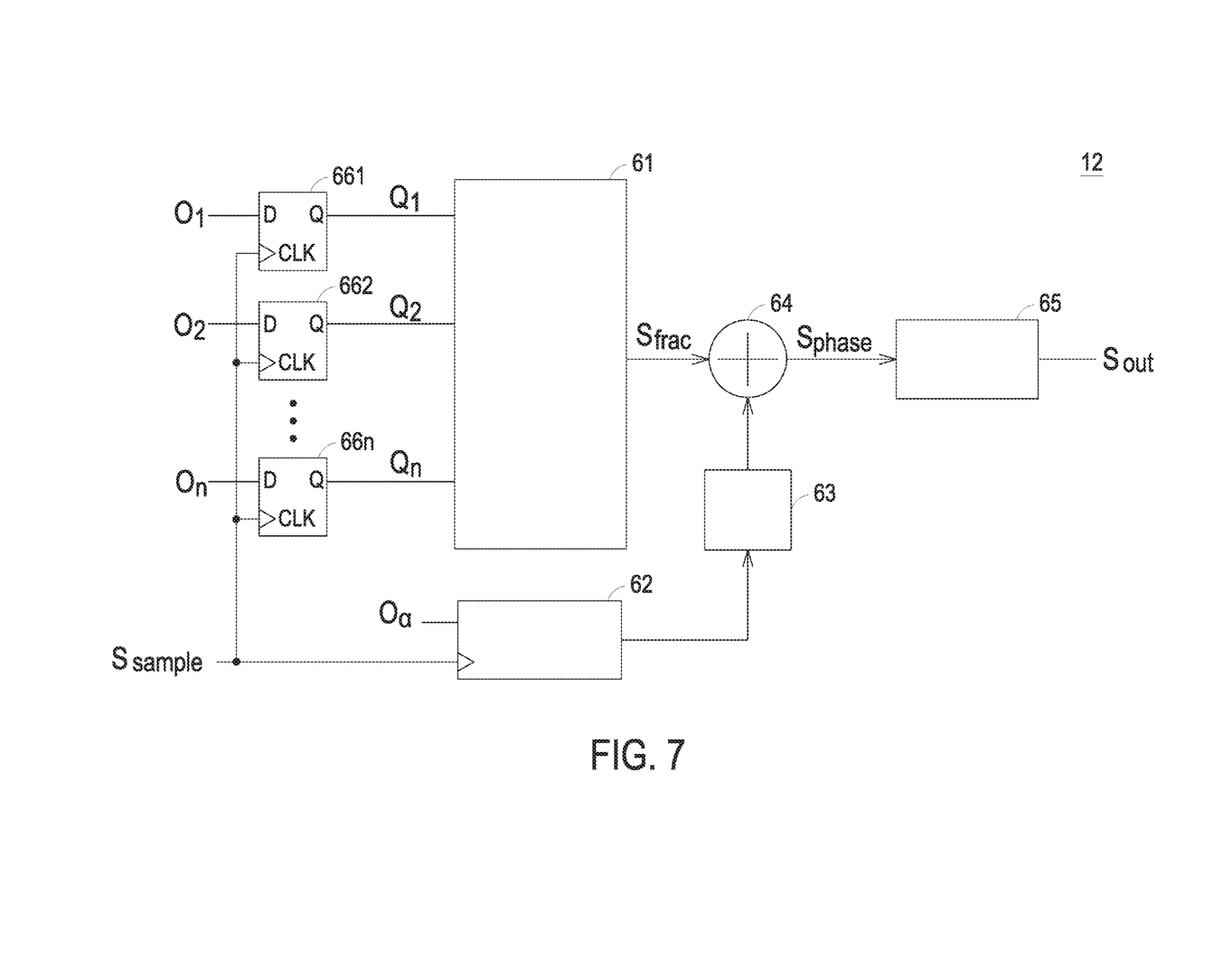
FIG. 7 is a schematic diagram illustrating an example of the measurement circuit of the time-to-digital converter of FIG. 1.

FIG. 7 is a schematic diagram illustrating an example of the measurement circuit of the time-to-digital converter of FIG. 1. As shown in FIG. 7, the measurement circuit 12 includes plural flip-flops 661 to 66n, a decoder 61 and a differentiator 65. The number of the flip-flops 661 to 66n is equal to the number of the delay signals $O_1$ to $O_n$. Each of the flip-flops 661 to 66n includes an input terminal D, a clock input terminal CLK and an output terminal Q. The input terminal D receives the corresponding delay signal ($O_1$ to $O_n$), the clock input terminal CLK receives the sampling signal $S_{sample}$, and the output terminal Q is electrically connected with the decoder 61 and outputs a sampled result ($Q_1$ to $Q_n$). Namely, the input terminals D of the flip-flops 661 to 66n receive the delay signals $O_1$ to $O_n$ respectively, and the output terminals Q of the flip-flops 661 to 66n output the sampled results $Q_1$ to $Q_n$ to the decoder 61 respectively. The decoder 61 identifies a digital code $S_{frac}$ to represent the oscillator phase based on the sampled results $Q_1$ to $Q_n$. The differentiator 65 is electrically connected with the decoder 61 for receiving the digital code $S_{frac}$ as the digitized oscillator phase $S_{phase}$. The differentiator 65 differentiates the plural digitized oscillator phases $S_{phase}$ at different sampling time and outputs the output signal $S_{out}$. In an embodiment, the decoder 61 is implemented by a lookup table (LUT) or an edge detector built with logic gates, but not exclusively.

In an embodiment, the measurement circuit 12 further includes at least one wrap counter 62, a multiplier 63 and an adder 64. At least one wrap counter 62 is configured for wrap counting to determine the number of oscillator cycles. The wrap counter 62 receives the sampling signal $S_{sample}$ and at least one delay signal $O_\alpha$, and outputs a count result. The delay signal $O_\alpha$ is for example but not limited to be selected from the delay signals $O_1$ to $O_n$. The multiplier 63 is electrically connected with the wrap counter 62 for receiving the count result. The multiplier 63 outputs a product of the count result and 2n, where n refers to the number of the delay signals $O_1$ to $O_n$, and 2n refers to the total phase number among an oscillator cycle. The adder 64 is electrically connected with the decoder 61 and the multiplier 63 for receiving the digital code $S_{frac}$ and the product respectively. Therefore, the adder 64 obtains the digitized oscillator phase $S_{phase}$ by summing up the digital code $S_{frac}$ and the product. The differentiator 65 is electrically connected with the adder 64 for receiving the digitized oscillator phase $S_{phase}$. The differentiator 65 differentiates the plural digitized oscillator phases $S_{phase}$ at different sampling time and outputs the output signal $S_{out}$.

From the above descriptions, the present disclosure provides a time-to-digital converter with an invertible oscillator. By utilizing two opposite oscillation directions of the same invertible oscillator, the impact of the oscillator phase noise to the output of the time-to-digital converter is reduced. In addition, the output of the time-to-digital converter is insensitive to the interference from the power supply since the impact of the power noise is partly cancelled out. Besides, the time-to-digital converter introduces only weak switching noise to the power supply because it only changes its oscillation direction and draws same amount of supply current during its operation. Therefore, the time-to-digital converter can share the same power supply with other modules in a higher-level time-to-digital converter application system without disturbing their operation. Due to its noise immunity and low disturbance to power supply, the time-to-digital converter can greatly reduce the design complexity of power supply in the application system.

While the disclosure has been described in terms of what is presently considered to be the most practical and preferred embodiments, it is to be understood that the disclosure needs not be limited to the disclosed embodiment.

What is claimed is:

1. A time-to-digital converter, comprising:
an oscillator controller for receiving a start signal and a stop signal and outputting a mode signal;
an invertible oscillator electrically connected with the oscillator controller for receiving the mode signal, wherein an oscillation direction of the invertible oscillator is inverted according to the mode signal, and the invertible oscillator outputs plural delay signals; and
a measurement circuit electrically connected with the invertible oscillator for receiving the plural delay signals, wherein the measurement circuit receives a sampling signal, samples the plural delay signals in accordance with the sampling signal, and outputs an output signal.

2. The time-to-digital converter according to claim 1, wherein the invertible oscillator comprises a mode inverter and plural invertible delay units, the mode inverter is electrically connected with each of the plural invertible delay units, and the plural invertible delay units are electrically connected with each other.

3. The time-to-digital converter according to claim 2, wherein each of the delay units comprises two input-output ports, and the plural input-output ports of the delay units are connected in a ring, wherein each of the delay units comprises a first internal inverter and a second internal inverter, one input-output port is electrically connected with an input terminal of the first internal inverter and an output terminal of the second internal inverter, and the other input-output port is electrically connected with an output terminal of the first internal inverter and an input terminal of the second internal inverter.

4. The time-to-digital converter according to claim 3, wherein when the mode signal is at high level, the first internal inverter is enabled, and the second internal inverter is disabled, when the mode signal is at low level, the first internal inverter is disabled, the second internal inverter is enabled, and the oscillation direction of the invertible oscillator when the mode signal is at low level is opposite to that of the invertible oscillator when the mode signal is at high level.

5. The time-to-digital converter according to claim 2, wherein each of the delay units is electrically connected with a bus transmitting the delay signals, each of the delay units comprises plural input ports, an output port, a first internal inverter and a second internal inverter, and an output terminal of the first internal inverter is electrically connected with an output terminal of the second internal inverter.

6. The time-to-digital converter according to claim 5, wherein when the mode signal is at high level, the first internal inverter is enabled, the second internal inverter is disabled, when the mode signal is at low level, the first internal inverter is disabled, the second internal inverter is enabled, and the oscillation direction of the invertible oscillator when the mode signal is at low level is opposite to that of the invertible oscillator when the mode signal is at high level.

7. The time-to-digital converter according to claim 2, wherein the number of the delay units is equal to the number of the delay signals.

8. The time-to-digital converter according to claim 1, wherein the measurement circuit comprises plural flip-flops, a decoder and a differentiator, the plural flip-flops receive plural delay signals and the sampling signal and output plural sampled results respectively, the decoder is electrically connected with the plural flips-flops for receiving the plural sampled results, the decoder outputs a digital code in accordance with the plural sampled results, the differentiator is electrically connected the decoder for receiving the digital code as an digitized oscillator phase, and the differentiator differentiates the digitized oscillator phases at different sampling time and outputs the output signal.

9. The time-to-digital converter according to claim 8, wherein each of the flip-flops comprises an input terminal, a clock input terminal and an output terminal, the input terminal receives the corresponding delay signal, the clock input terminal receives the sampling signal, and the output terminal is electrically connected with the decoder and outputs the sampled result.

10. The time-to-digital converter according to claim 8, wherein the measurement circuit further comprises at least one wrap counter, a multiplier and an adder, the at least one wrap counter receives at least one delay signal and the sampling signal and outputs a count result, the multiplier is electrically connected with the wrap counter for receiving the count result, the multiplier outputs a product by multiplying the count result by twice the number of the delay signals, the adder is electrically connected with the multiplier and the decoder for receiving the product and the digital code respectively, the adder obtains the digitized oscillator phase by summing up the digital code and the product, the differentiator is electrically connected the adder for receiving the digitized oscillator phase, and the differentiator differentiates the digitized oscillator phases at different sampling time and outputs the output signal.

11. The time-to-digital converter according to claim 8, wherein the decoder outputs the digital code in accordance with the plural sampled results by a lookup table or an edge detector with logic gates.

12. The time-to-digital converter according to claim 8, wherein the number of the plural flip-flops is equal to the number of the delay signals.

13. The time-to-digital converter according to claim 1, wherein a time difference between a time duration of the mode signal at high level and a time duration of the mode signal at low level is achieved by multiplying the output signal by an average internal stage delay as the following equation:

$$T_{diff}=S_{out} \times t_{stage}$$

where $T_{in}$ is the time difference, $S_{out}$ is the output signal and $t_{stage}$ is the average internal stage delay.

14. The time-to-digital converter according to claim 13, wherein an input time equal to the time duration of the mode signal at high level is obtained from a sampling clock period, the output signal and the average internal stage delay as the following equation:

$$T_{in}=(T_{sample}+S_{out} \times t_{stage})/2$$

where $T_{in}$ is the input time, and $T_{sample}$ is the sampling clock period.

15. The time-to-digital converter according to claim 14, wherein a resolution of the time-to-digital converter is defined by half of the average internal stage delay.

* * * * *